United States Patent [19]
Bronner et al.

[11] Patent Number: 5,606,188
[45] Date of Patent: Feb. 25, 1997

[54] FABRICATION PROCESS AND STRUCTURE FOR A CONTACTED-BODY SILICON-ON-INSULATOR DYNAMIC RANDOM ACCESS MEMORY

[75] Inventors: Gary B. Bronner, Dutchess County, N.Y.; John K. DeBrosse, Chittenden County, Vt.; Jack A. Mandelman, Dutchess County, N.Y.

[73] Assignee: International Business Machines Corporation, Armonk, N.Y.

[21] Appl. No.: 428,968

[22] Filed: Apr. 26, 1995

[51] Int. Cl.$^6$ .......... H01L 27/108; H01L 27/01; H01L 29/76
[52] U.S. Cl. .......... 257/301; 257/304; 257/305; 257/349; 257/350; 257/401
[58] Field of Search .......... 257/304, 305, 257/349, 350, 409, 301

[56] References Cited

U.S. PATENT DOCUMENTS

| | | | |
|---|---|---|---|
| 4,888,631 | 12/1989 | Azuma et al. | 257/66 |
| 4,894,697 | 1/1990 | Chin et al. | 257/302 |
| 4,920,065 | 4/1990 | Chin et al. | 257/302 |
| 5,001,526 | 3/1991 | Gotou | 257/302 |
| 5,049,521 | 9/1991 | Belanger et al. | 437/62 |
| 5,055,898 | 10/1991 | Beilstein, Jr. et al. | 257/409 |
| 5,102,819 | 4/1992 | Matsushita et al. | 437/52 |
| 5,355,012 | 10/1994 | Yamaguchi et al. | 257/368 |
| 5,440,161 | 8/1995 | Iwamatsu et al. | 257/350 |
| 5,479,048 | 12/1995 | Yallup et al. | 257/350 |
| 5,508,219 | 4/1996 | Bronner et al. | 437/52 |
| 5,525,531 | 6/1996 | Bronner et al. | 437/52 |
| 5,528,062 | 6/1996 | Hsieh et al. | 257/298 |

FOREIGN PATENT DOCUMENTS 6-21386  1/1994  Japan .......... 257/305

OTHER PUBLICATIONS

IBM Technical Disclosure Bulletin, "Method For Making a Dynamic Random–Access Memory Cell" vol. 32 No. 4A Sep. 1989.

Primary Examiner—Mahshid D. Saadat
Assistant Examiner—Jhihan B. Clark
Attorney, Agent, or Firm—Whitham, Curtis, Whitham & McGinn; Susan M. Murray

[57] ABSTRACT

An SOI DRAM includes a direct body contact between the SOI layer and the silicon substrate, and field-shield isolation positioned on the surface of the SOI structure which extends over the direct body contact. Deep trench storage capacitors are positioned adjacent the direct body contact.

13 Claims, 8 Drawing Sheets

FABRICATION PROCESS AND STRUCTURE FOR A CONTACTED-BODY SILICON-ON-INSULATOR DYNAMIC RANDOM ACCESS MEMORY

BACKGROUND OF THE INVENTION

1. Field of the Invention

The present invention generally relates to semiconductor memory cell structures and fabrication methods therefore and, more particularly, to methods of fabrication and a structure for a contacted-body silicon-on-insulator (SOI) dynamic random access memory (DRAM) which uses deep trench storage capacitors and field-shield isolation.

2. Background Description

As operating voltages are reduced, it becomes increasingly challenging to write a usable high level into a DRAM storage capacitor because of the limiting effects of subthreshold slope and substrate sensitivity. Threshold voltage has become essentially unscalable with bulk metal oxide semiconductor field effect transistors (MOSFETs) operating at room temperature, since minimum threshold voltage is determined by off-current requirements and subthreshold slope, not with operating voltage or geometry. Furthermore, device substrate sensitivity increases the threshold voltage and compounds the loss of overdrive during writeback of a high level.

SUMMARY OF THE INVENTION

It is therefore an object of the present invention to provide a fabrication process and structure for a contacted-body SOI DRAM which uses deep trench storage capacitors and field-shield isolation.

According to the invention, a SOI DRAM is constructed in a manner which allows body contact to be made to every SOI device while allowing field-shield to remain over every body contact. The fabrication technique provides the advantages of low field-shield sheet resistance and improved planarization. The contacted-body SOI DRAM, made with deep trench storage, allows scalability to below 2 volt (2V) operation.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

SOI MOSFET devices exhibit near ideal subthreshold slope and negligible substrate sensitivity, resulting in significantly reduced array device source-follower threshold voltage $(V_t)$ during the writeback operation (typically greater than 500 mV reduction is realized). This means that an increased high level may be written with the same wordline voltage, or the same high level may be written with reduced wordline voltage (for reliability improvement). However, for an SOI DRAM array device it is essential that the SOI body be contacted for avoiding charge storage effects which can lead to signal leakage, bipolar conduction, and snapback.

This invention is particularly related to the fabrication process and structure for a contacted-body SOI DRAM which uses deep trench storage capacitors and field-shield isolation. "Deep trench" means a trench that is approximately 1–7 μm or deeper in a SOI wafer. A deep trench storage capacitor has the advantages of allowing large storage capacitance with planar topography. "Field-shield isolation" involves having a conducting layer insulated from a semiconductor or substrate. The conducting layer is electrically biased to prevent parasitic conduction from diffusion to diffusion. Field-shield isolation is most practical when all the SOI devices are the same type(e.g., all n-FETs or all p-FETs).

Figure 1:
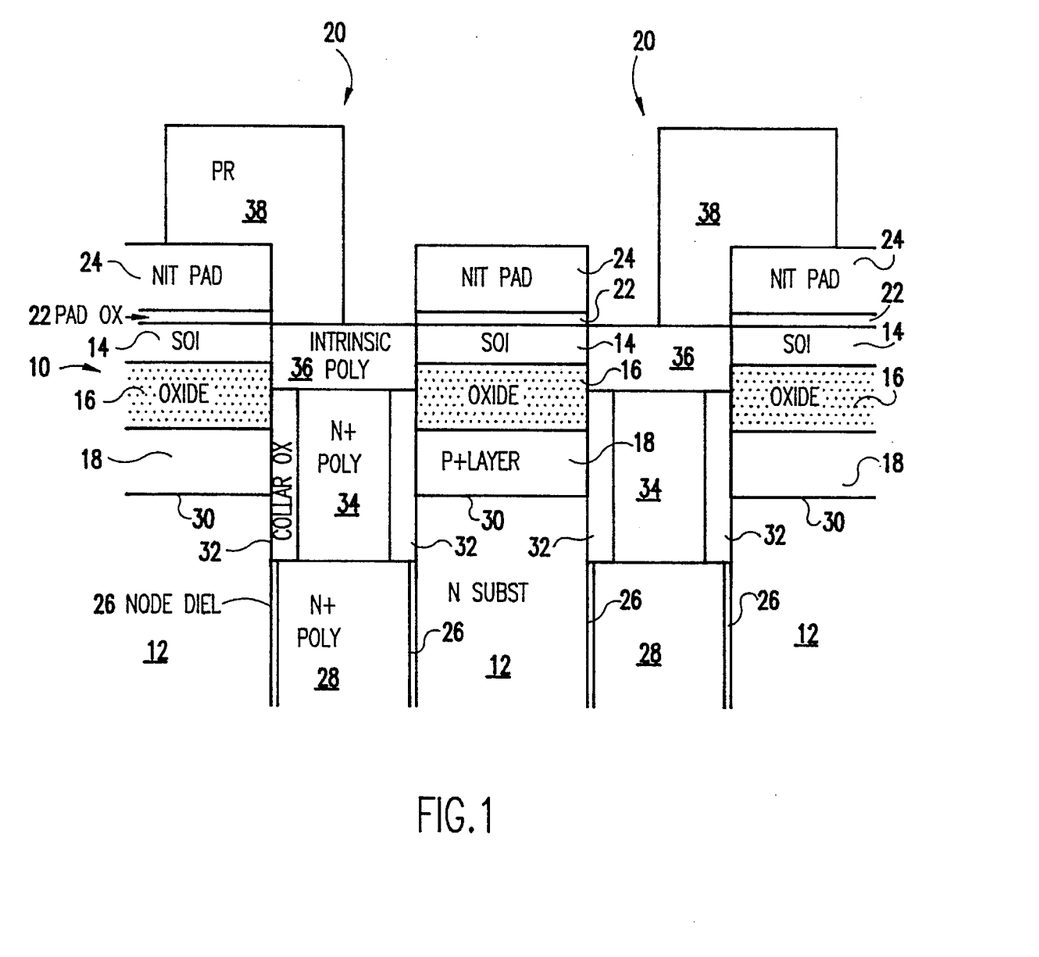
FIG. 1 is a cross-sectional side view of an SOI wafer having n-type substrate which is used for fabricating the body contacted SOI DRAM of the present invention and illustrates processing through strap mask photoresist development

With reference to FIG. 1, an SOI wafer 10 having an n-type substrate 12 is used for the starting material. It should be understood that the nature of the substrate 12 is not a limiting feature of this invention and is only identified as n-type for exemplary purposes. For example, the substrate 12 could also be a p-type substrate or a p-type substrate with an n-region created by doping, etc. The n-type substrate 12 will be used for the storage capacitor plate in an n-channel array. The SOI wafer 10 includes a silicon layer 14, referred to as the SOI layer, positioned on top of an oxide layer 16, referred to as the "SOI back oxide" or "insulator". SOI wafers can be made by a wide variety of processes including bond and etch-back and SIMOX. In the practice of this invention, it is recommended that the SOI layer 14 have a thickness ranging from 250 to 2500Å and that the SOI back oxide layer 16 have a thickness ranging from 250 to 4000Å. A buried P+layer 18 is fabricated below the SOI back oxide 16 by boron implantation or other means. The P+layer 18 will be used to provide a wiring level for the contacted body. Preferably, the P+layer 18 has a thickness ranging from 250Å to 1 μm.

After formation of the P+layer 18, a plurality of deep trenches are made in the SOI wafer 10 at regions 20. Areas to be protected from deep trench formation are protected by the patterned pad oxide 22 and nitride (silicon nitride) layer 24. The pad oxide 22 and nitride layer 24 can be applied by a variety of techniques including thermal growth and deposition. After using a "Deep Trench" or "DT" mask (not shown) to define the pattern in the nitride layer 24, deep trenches of approximately 1–7 μm or deeper are etched at regions 20 using reactive ion etching (RIE), laser etching, wet etching, or other suitable technique.

After formation of deep trenches in regions 20 of the SOI wafer 10, a node dielectric 26 is formed on the bottom portion of the trenches. The node dielectric 26 serves as the insulator of the storage capacitor at the bottom of the deep trench, with the n-type substrate 12 serving as the storage capacitor plate in an n-channel array. N+polysilicon 28 is used to fill the trenches and then recessed to below the buried P+layer 18 substrate junction 30. This defines where the bottom of the isolation collar will be. The isolation collar provides protection against leakage mechanisms enhanced by the field from the storage node poly. The effect of gate-field on the leakage characteristics of heavily doped junctions is discussed in Noble et al., *IEEE Transactions on Electron Devices*, Vol. 36, No. 4, April 1989.

Next, the exposed node dielectric is removed, and the collar oxide 32 is formed. The collar oxide is preferably $SiO_2$ and should have a thickness of 250–600Å. Formation of the collar oxide may be performed by any of a number of processes; however, chemical vapor deposition (CVD) followed by RIE is preferred. After forming the collar oxide 32, the wafer is filled with polysilicon 34. This polysilicon 34 may be N+ or intrinsic, depending on the amount of the buried strap outdiffusion desired (specifically, diffusion of n-type dopant (arsenic, etc.) into the SOI layer 14). Using intrinsic polysilicon 34 may reduce diffusion from N+poly 28, through N+poly 34, through intrinsic poly 36, to SOI layer 14. After filling, the polysilicon 34 is recessed such that the top of the polysilicon 34 lies within limits of the back oxide 16. The collar oxide 32 is also similarly recessed. Then, the recess is filled to the SOI 14 surface by depositing intrinsic polysilicon 36.

Connections between the array transistor (the SOI device) and the storage capacitor in the deep trench are created using a "strap mask" or "ST mask", wherein the "strap" is the polysilicon bridge 36 to the SOI layer 14 (i.e., N+poly 34 to intrinsic poly 36 to SOI layer 14). The strap mask (not shown) is used to define a photoresist or "PR" pattern 38 on top of the SOI wafer 10. With the PR pattern 38 in place, a vertical etch through the polysilicon 36 and 34 and the collar oxide 32 in portions of the deep trench regions 20 is performed.

Figure 2:
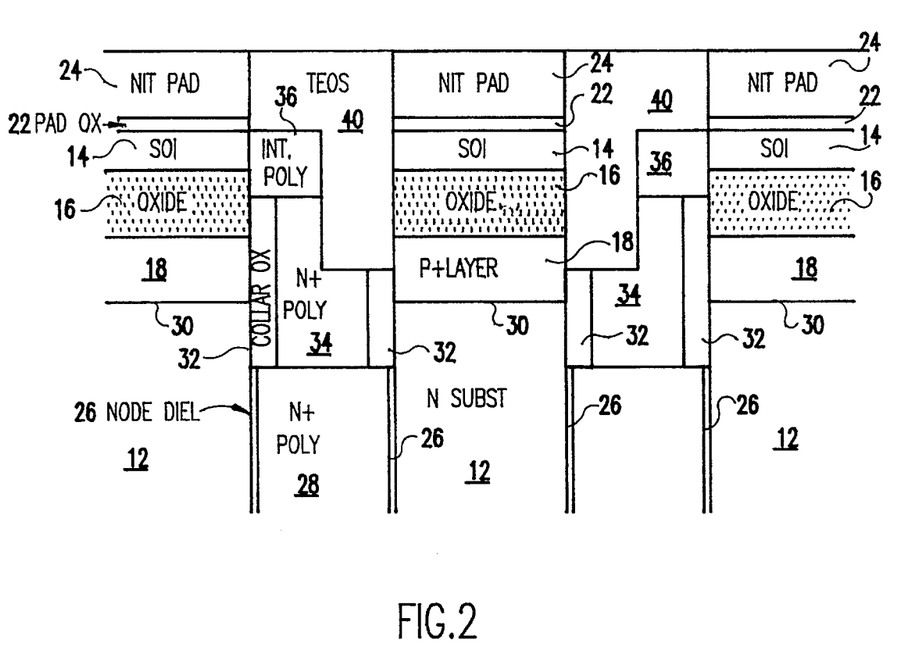
FIG. 2 is a cross-sectional side view of the SOI wafer of FIG. 1 which illustrates processing through TEOS planarization.

As is best shown in FIG. 2, the vertical etch extends past the bottom of the back oxide layer 16. Preferably, the vertical etch is performed by RIE or the like. Regions not covered by the nitride pad 24 or PR 38 will be etched by RIE. When the etch is complete, the PR 38 is stripped. Tetraethoxysilane (TEOS) 40 ($SiO_2$ is formed from TEOS) is then deposited in the etched opening and the wafer is planarized to the top of the nitride pad 24.

A standard "active area" or "AA" process is now used for isolation in the supports or peripheral circuitry (e.g., CMOS logic). Active areas are those areas on the wafer where active devices are present. All other areas are inactive and are used for isolation of the active devices.

Figure 3:
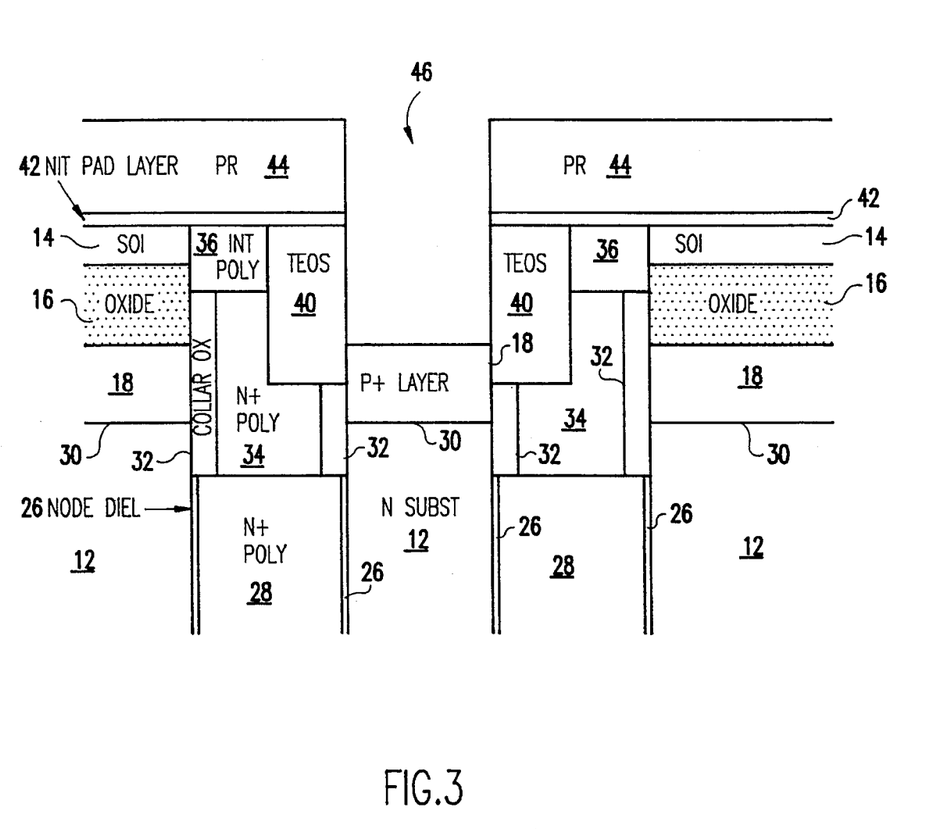
FIG. 3 is a cross-sectional side view of the SOI wafer of FIGS. 1 and 2 which illustrates processing after opening SOI and backoxide for body contacts.

After active areas are defined in the supports and with particular reference to FIGS. 2 and 3, the nitride pads 24, pad oxide 22, and the top portion of TEOS 40 are removed down to SOI layer 14 to achieve a planar structure. The nitride pad 24 removal can be achieved using hot phosphoric acid processes, and the oxide pad 22 can be removed using hydrogen fluoride (HF) processes. Other removal techniques might also be employed. Subsequently, a nitride pad layer 42 is deposited and a photoresist 44 is applied over the nitride pad layer 42 and is patterned using a "body contact" or "BC" mask (not shown) and standard photolithography and development procedures. The exposed regions 46 are etched down through the SOI layer 14 and back oxide layer 16 to the P+buried layer 18. This is the site where the "body contact" is to be made. The body contact is an electrical contact from the SOI layer 14 to the P+poly (48). Etching is preferably performed by RIE or other suitable processes.

Figure 4:
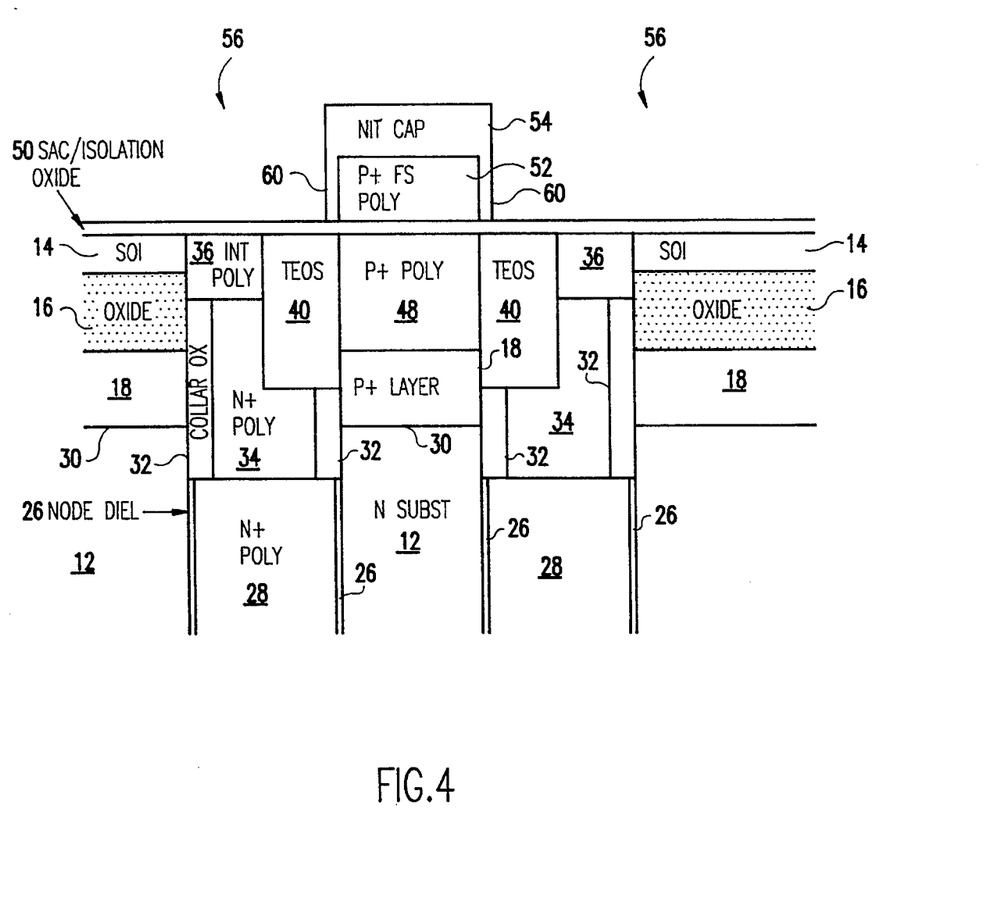
FIG. 4 is a cross-sectional side view of the SOI wafer of FIGS. 1–3 which illustrates processing through field-shield patterning.

With reference to FIGS. 3 and 4, P+polysilicon 48 is filled in the opening at the body contact site, and then polished down to the nitride layer 42. The nitride layer 42 protects the silicon surface during polishing. After polishing, the nitride pad layer 42 is removed. A sacrificial oxide layer 50 is then grown over the surface of the SOI wafer 10. This oxide will serve as the isolation oxide under the field-shield. Threshold voltage (Vt) tailoring is then performed by ion implantation of p type species (e.g., boron) into the SOI layer 14.

With particular reference to FIG. 4, a P+polysilicon field-shield 52 layer is deposited on the sacrificial oxide layer 50 and is covered with nitride cap 54 layer. A "field-shield" or "FS" mask then defines the field-shield pattern in the two layers 52 and 54 and produces open array active areas 56. The open array active areas 56 may take the form of stripes or other geometries.

Figure 5:
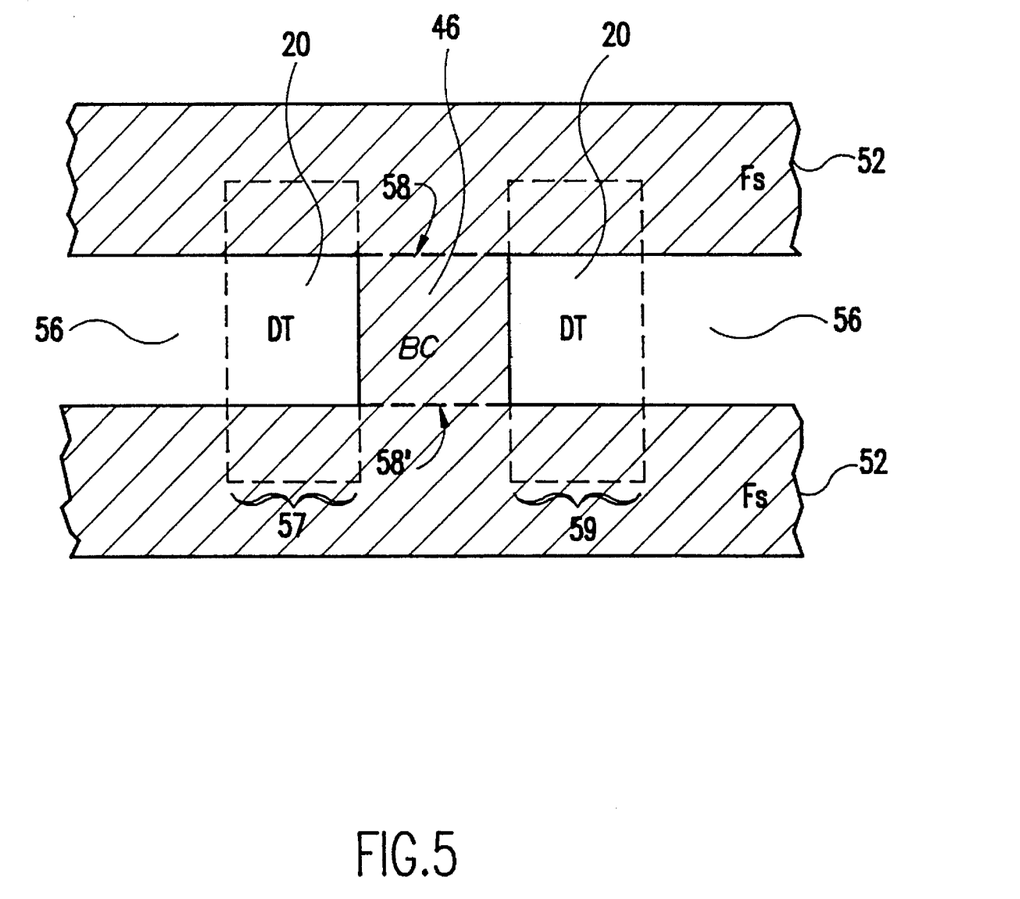
FIG. 5 is a top view of the SOI wafer of FIG. 4 which illustrates the location of open array active areas in the field-shield created with a field-shield mask.

With reference to both FIGS. 4 and 5, it can be seen that the deep trench regions 20 cross under the field-shield 52 at regions 57 and 59, and the body contact region 46 is positioned between the regions 57 and 59. In the body contact region 46, the top portion of the deposited P+polysilicon 48 contacts the silicon film part of the SOI layer——which underlies field-shield 52 at regions 58 and 58'. This direct body contact to the SOI is an important feature of this invention. It should be understood that other geometries from that shown in FIG. 5 which allow the direct body contact to the SOI could be used within the practice of this invention.

The open array active areas 56 are positioned at sites where it is desired to later form the active areas and bit line contacts of the contacted-body SOI DRAM of the present invention. Since the body contact has already been formed, as per the deposited P+polysilicon 48, field-shield 52 may be left over the body contact areas 46, providing bridges between field-shield isolation stripes and reducing its sheet resistance. Improved planarization is also realized from the more extensive field-shield coverage. The P+polysilicon 48 provides an additional built-in bias compared to using N+poly for the field-shield (e.g., approximately 1v) for shutting off the isolation regions. Additionally, any boron diffusion through the isolation oxide 50 will improve isolation.

With reference back to FIG. 4, nitride spacers 60 are formed on the edges of the field-shield 52 in the open array active areas 56. FIG. 4 shows a field-shield bridging over the body contact described in conjunction with FIGS. 1–5. As is shown in FIG. 5, the field-shields can be connected together over a body contact region. The field-shield provides isolation between the N+ diffusion in the array. To provide isolation, the field-shield 52 and the P+polysilicon 48 plug are both electrically biased negative with respect to N+source-drain diffusions. Voltages are applied to conducting layers (not shown) brought out to the periphery of the array.

Figure 6:
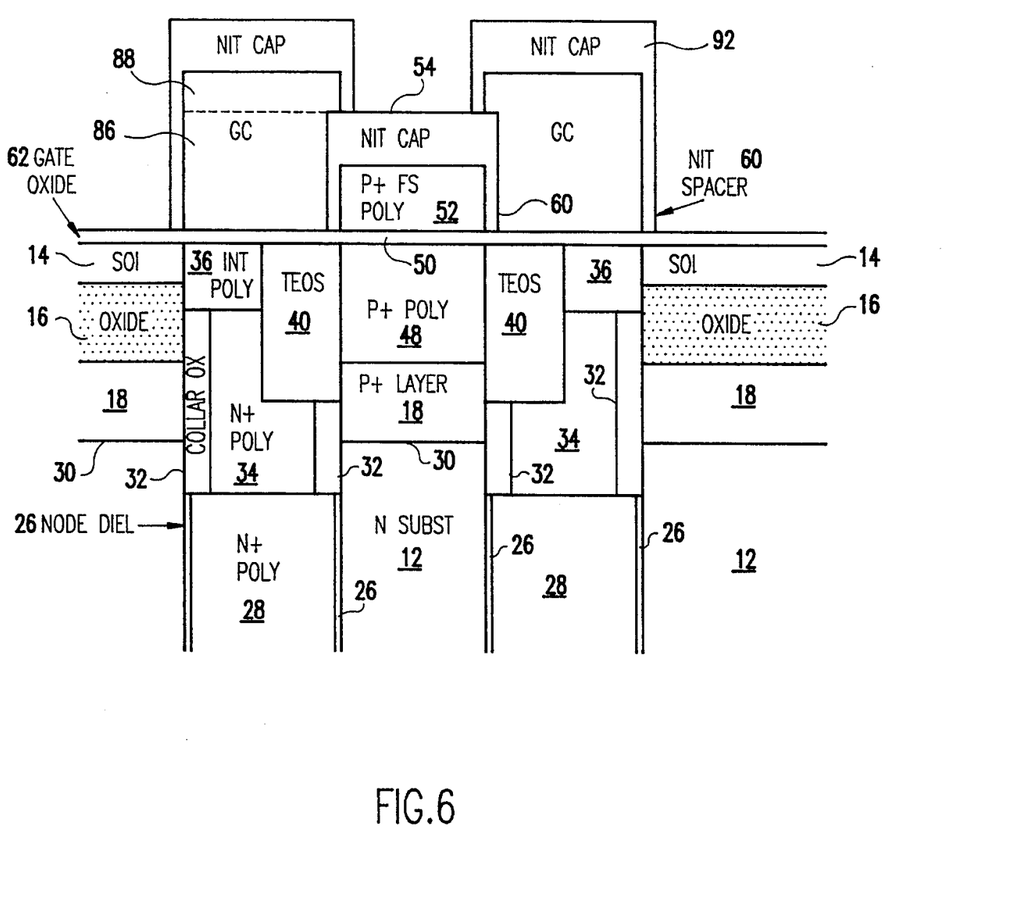
FIG. 6 is a cross-sectional side view of the SOI wafer of FIGS. 1–4 which illustrates processing through the damascene GC level.

FIG. 6 illustrates some of the final processing steps for body contacted SOI DRAM fabrication. First the sacrificial oxide 50 (shown in FIG. 4) is removed, and a gate oxide 62 is grown in its place. The gate oxide 62 provides superior insulation compared to the sacrificial oxide 50 since it has not been exposed to the etchants and other processes used when patterning the polysilicon field-shield 52.

It is envisaged that it will be advantageous to use shallow trench isolation (STI) or other suitable below-surface isolation in the supports or peripheral circuitry (e.g., CMOS logic, etc.), and field-shield isolation for the DRAM array. Below-surface isolation in a substrate may take the form of shallow trench isolation (STI) or similar structure schemes wherein the isolation regions are created in the substrate and extend below the surface. Field-shield isolation is effective and easily applied to areas containing only one transistor type (n-FET or p-FET), such as a DRAM array. Furthermore, field-shield isolation is free of corner parasitic effects and threshold voltage (V$t$) control problems associated with STI. However, field-shield isolation in the chip area containing CMOS support circuitry is wasteful of silicon real estate. Thus, there is a need for using STI for CMOS logic when field-shield isolation is desired in the array.

Figure 7A:
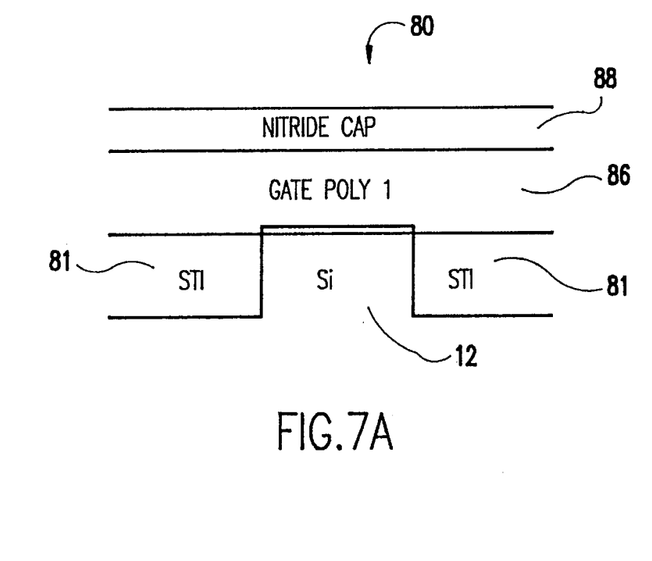
FIGS. 7a and 7b show formation of a first gate conductor layer in the field-shield array as well as the supports or peripheral circuitry (e.g., CMOS logic)
Figure 7B:
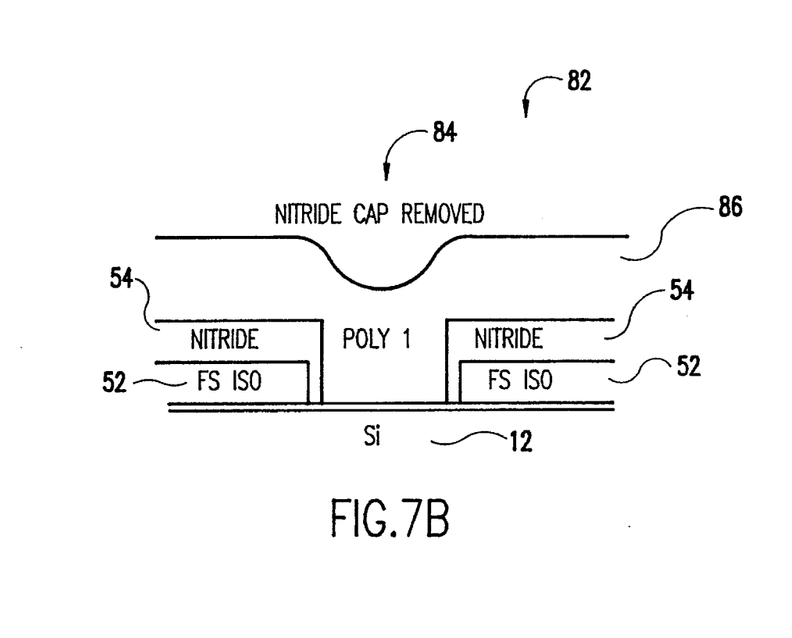

FIGS. 7a and 7b show the creation of a planarized gate conductor on a substrate having both field-shield isolation and STI. In FIGS. 7a–b, the Si substrate is representative of the substrate presented in FIG. 4 of the application, wherein FIG. 7b shows the field-isolation 52 and nitride cap 54 shown in FIG. 4. The substrate 12 in FIGS. 7a and 7b, includes STI regions 80 comprising trench isolations 81, and field shield regions 82 comprising a plurality of conductive field shield isolation regions 52 over coated with an insulating layer 54 such as silicon nitride. The combined thickness of the field shield isolation deposits 52 and insulating layer 54 ranges between 600 and 6000Å. Openings 84 are made in the field-shield isolation for the active device areas using standard techniques such as photolithography and etching. A gate conductor 86 material, such as polysilicon, metal, etc., is then deposited over both the STI isolated region 80 shown in FIG. 7a and the field-shield isolated region shown in FIG. 7b. To assure planarity, the gate conductor 86 should be approximately equal to the thickness of the field-shield regions 82. As is best shown in FIG. 7b, a depression results at the opening 84 which is the site of the active area/isolation step.

A protective cap 88 such as silicon nitride or the like is deposited over both regions (e.g., the STI region shown in FIG. 7a, and the field-shield region shown in FIG. 7b). A mask (not shown) is then used to pattern and remove the nitride cap 88 from the gate conductor 86 in the field-shield array. This is best shown by contrasting FIGS. 7a and 7b. Subsequently, as is best shown in FIG. 8b, chemical-mechanical polishing or another suitable process that selectively removes the polysilicon in gate conductor 86 relative to the silicon nitride in the protective cap 88 is used to remove the gate conductor 86 down to the level of the field-shield features 52 and 54. This process leaves a portion of the gate conductor 86 between separate field-shield features 52 and 54, and leaves gate conductor 86 over the STI regions 80.

The protective cap 88 protects the underlying gate conductor 86 in the STI region during chemical-mechanical polishing. After polishing, the nitride cap 86 is removed from the STI isolated portion of the substrate (e.g., the peripheral circuitry such as CMOS logic). In the case of the protective cap 88 being silicon nitride, removal of the cap can be achieved by etching with hot phosphoric acid or by reactive ion etching (RIE). It should be noted that the protective cap 86 should be removed from the STI isolated region shown in FIG. 7a, but the insulating layer 54 of the field-shield region shown in FIG. 8b should not be removed. This can be accomplished by using different materials for the insulating layer 54 and the protective cap 88, and using an etchant that is selective for the material in the protective cap 88. Alternatively, if the protective cap 88 and the insulating layer 54 are the same material (e.g., silicon nitride), the protective cap 88 should be smaller in thickness than the insulating layer 54 so that removal of the protective cap 88 can be achieved without removing all of the insulating layer 54. This is easily accomplished since the protective cap 88 serves the function of a polishing stop layer, and need not be very thick.

Figure 8A:
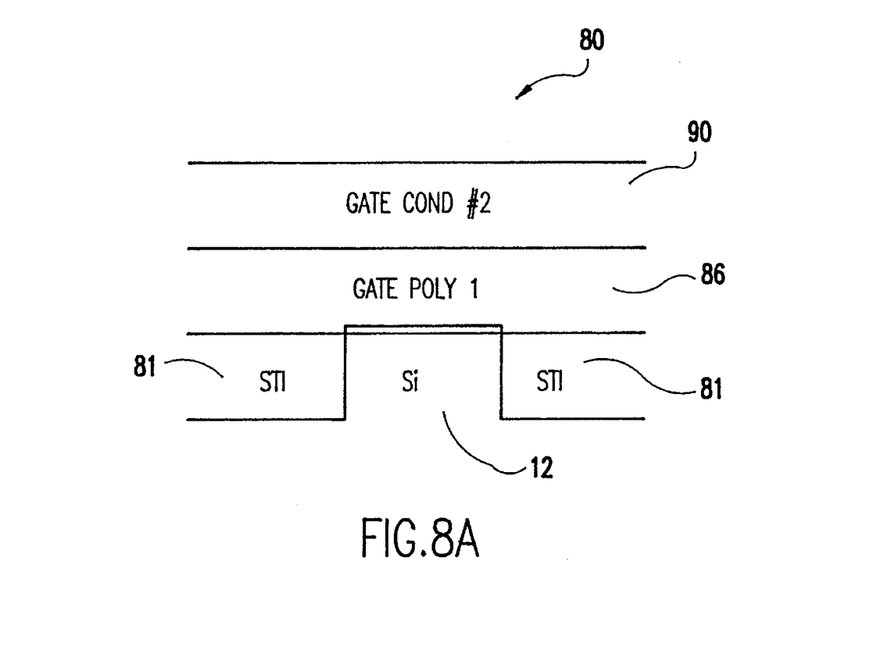
FIGS. 8a and 8b show formation of a second gate conductor layer over both the field-shield array and the peripheral circuitry.
Figure 8B:
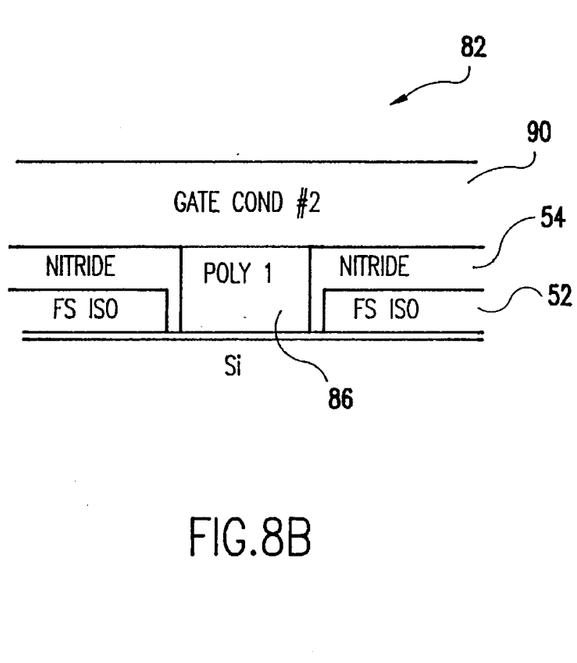

As is shown in FIGS. 8a and 8b, a second layer of conductive material 90, such as polysilicon, silicide, metal, etc., is deposited over the entire substrate to produce a substrate with a planar gate conductor in both the STI isolated region and the field-shield isolated region.

With reference back to FIG. 6, it can be seen that the gate conductor in the active area is composed of two polysilicon layers 86 and 88 as described in FIGS. 7a–b and 8a–b. After formation of the gate conductor layers, wordlines are etched into the gate conductor, junction implants are made, and nitride spacers 92 can be formed over the gate conductor according to conventional processes. In a preferred embodiment, contact to the P+poly 48 which makes the body contact with the SOI layer 14 are made every 512 wordlines. The entire structure may subsequently be overcoated with a glass such as phosphosilicate glass (PSG) or borosilicate glass (BSG), and then planarized. The substrate is then finished using standard processing techniques for subsequent wiring levels.

While the invention has been described in terms of a single preferred embodiment, those skilled in the art will recognize that the invention can be practiced with modification within the spirit and scope of the appended claims.

We claim:

1. A body-contacted silicon-on-insulator dynamic random access memory, comprising:

a substrate including a silicon layer, an insulator layer positioned on said silicon layer, and a silicon-on-insulator layer positioned on said insulator layer;

a conductive material contacting said silicon-on-insulator layer, said conductive material traversing through said silicon-on-insulator layer and said insulator layer and contacting said silicon layer;

a field-shield isolation region positioned on a surface of said substrate above said conductive material; and deep trench storage capacitors formed in said substrate, wherein said deep trench storage capacitors are laterally adjacent and bound side edges of said conductive material contacting said silicon-on-insulator layer and said silicon layer.

2. The body-contacted silicon-on-insulator dynamic random access memory of claim 1 further comprising an insulator layer positioned between said surface of said substrate and said field-shield isolation region.

3. The body-contacted silicon-on-insulator dynamic random access memory of claim 1 further comprising a gate conductor positioned on said surface of said substrate adjacent said field-shield isolation region.

4. The body-contacted silicon-on-insulator dynamic random access memory of claim 1 wherein said conductive material contacting said silicon-on-insulator layer and said silicon layer is polysilicon.

5. The body-contacted silicon-on-insulator dynamic random access memory of claim 1 wherein said field-shield isolation region includes an insulator positioned on said surface of said substrate, a conductive field-shield material positioned on said insulator, and a protective cap positioned over said conductive field-shield material.

6. The body-contacted silicon-on-insulator dynamic random access memory of claim 1 wherein a portion of said substrate located below said silicon layer has a first conductivity type, and said conductive material and said silicon layer both have a second conductivity type which is opposite to said first conductivity type.

7. The body-contacted silicon-on-insulator dynamic random access memory of claim 1 wherein said silicon-on-insulator layer is a continuous layer.

8. The body-contacted silicon-on-insulator dynamic random access memory of claim 1 wherein said deep trench storage capacitors are laterally adjacent and bound side edges of said conductive material.

9. The body-contacted silicon-on-insulator dynamic random access memory of claim 6 wherein said substrate is an n-type material and said conductive material and said silicon layer each is P+type material.

10. A body-contacted silicon-on-insulator dynamic random access memory of claim 10 wherein said silicon layer is a region of doped silicon material located in a surface portion of said substrate, and said conductive material comprises a doped polysilicon layer located above and contacting said silicon layer.

11. The body-contacted silicon-on-insulator dynamic random access memory of claim 10 wherein said substrate is an n-type material, and said conductive material and said silicon layer is P+type material.

12. The body-contacted silicon-on-insulator dynamic random access memory of claim 11 wherein said silicon layer is a wiring level for a body contact comprised of said contact between said conductive material and said silicon-on-insulator layer.

13. A body-contacted silicon-on-insulator dynamic random access memory , comprising:

a substrate including a silicon layer an insulator layer positioned on said silicon layer, and a Silicon-on-insulator layer positioned on said insulator layer;

a conductive material contacting said silicon-on, insulator layer, said conductive material traversing through said silicon-on-insulator layer and said insulator layer and contacting said silicon layer;

a field-shield isolation region positioned on a surface of said substrate above said conductive material, wherein said field-shield isolation region is P+polysilicon material; and deep trench storage capacitors formed in said substrate, wherein said conductive material contacting said silicon-on-insulator layer and said silicon layer is located between said deep trench storage capacitors.

\* \* \* \* \*